TRACK AND HOLD SERVOCONTROL CIRCUIT

Filed Nov. 28, 1967 3 Sheets-Sheet 1

INVENTOR.
HENRY O. WOLCOTT
BY Harry R. Lubcke
AGENT

INVENTOR.
HENRY O. WOLCOTT
BY Harry R. Lubcke
AGENT

INVENTOR.
HENRY O. WOLCOTT
BY Harry R. Lubcke
AGENT

United States Patent Office 3,382,461
Patented May 7, 1968

3,382,461
TRACK AND HOLD SERVOCONTROL CIRCUIT

Henry O. Wolcott, Chatsworth, Calif., assignor to Optimation, Inc., Sun Valley, Calif., a corporation of California Filed Nov. 28, 1967, Ser. No. 686,242
10 Claims. (Cl. 331—183)

ABSTRACT OF THE DISCLOSURE

An electrical output-to-input signal control circuit having plural semiconductor elements to rectify separate in-phase and quadrature components of the signal to be controlled. Rectified components of opposite polarities of the signal are formed into a short sampling pulse in a comparator circuit at the time that the quadrature component passes through zero amplitude and the in-phase component has one polarity. This pulse gates a semiconductor element, which compares the instantaneous value of the signal during the time of the sampling pulse with a constant reference voltage and produces an amplitude error signal of the track and hold type. The error signal passes through an error amplifier, which has a first feedback circuit of long time constant and high gain for long period control and a second feedback circuit of low gain and short time constant for cycle-to-cycle control. The output of the error amplifier controls a further semiconductor element, which is connected to the signal source required to be controlled.

*Background of the invention*

The invention is concerned with an output-to-input type of servo control circuit which employs a track and hold type of control derived from a narrow sampling pulse. An application of the circuit is to maintain constant the amplitude of the output of an oscillator.

The prior art has accomplished such control by rectifying and filtering the output and employing the relatively constant electrical energy level resulting for the control of the oscillator or equivalent device. The low pass filter necessarily employed had to have a long time constant to remove essentially all of the ripple of signal frequency. Such a long time constant results in over-correction, with a recurring damped oscillation of the controlled output above and below the controlled level desired. Such over-correction may be caused by any type of shock to the circuit, including power transients or switching the controlled device from one range to another. This oscillation may last as long as two minutes in test instruments of the prior art. During this time, of course, the instrument cannot be used for meaningful tests.

*Summary of the invention*

This invention overcomes the shortcomings of the prior art by sampling the amplitude of each cycle of the signal to be controlled and forming a control signal by holding the value of the sample until the next sample is taken.

This results in substantially no delay in making a correction, thus over-correction does not occur.

The error amplifier has two time constants, one that is short and causes the required correction to be completely or largely accomplished in one cycle of the alternating frequency controlled; the other that is long and handles hour-to-hour or day-to-day variations, accomplishing the correction in a period of the order of ten seconds.

The in-phase and quadrature-phase signal inputs are rectified and a short sampling pulse is produced in an overdriven differential amplifier (comparator). This pulse is applied to the gate of a field effect transistor ("FET"), which operates as a bi-directional switch. During the duration of the pulse the FET is "on"; i.e., the switch is closed. A capacitor connected to the drain of the FET is thereby charged to the voltage level of the signal at that time. The signal is introduced upon the source of the FET.

The field effect transistor is normally operated at a zero correction signal level. This is purposely accomplished by arranging the algebraic sum of the instantaneous amplitude of the signal and the amplitude of a constant reference voltage to typically be zero. This has the important advantage that the temperature charatceristic of the "on" resistance of the FET has essentially no effect upon the servo operation of the loop. Where a correction signal in prior art loops operates one or more semiconductor elements at normal signal levels (instead of zero) the temperature characteristic of the semicondutcor material exercises its known undesirable effect.

The capacitor mentioned retains the voltage level of the signal at the time of the cessation of the sampling pulse until the occurrence of the next pulse. A servo operational amplifier connected to the capacitor provides a high impedance take-off so that the charge will not be appreciably lost from cycle to cycle.

The track and hold system is substantially aperiodic with respect to the frequency of the signal controlled. The comparator gives a sampling pulse that is a constant percentage of the period of the alternating signal controlled, which percentage is typically under 5%.

*Description of the preferred embodiment*

Figure 1:
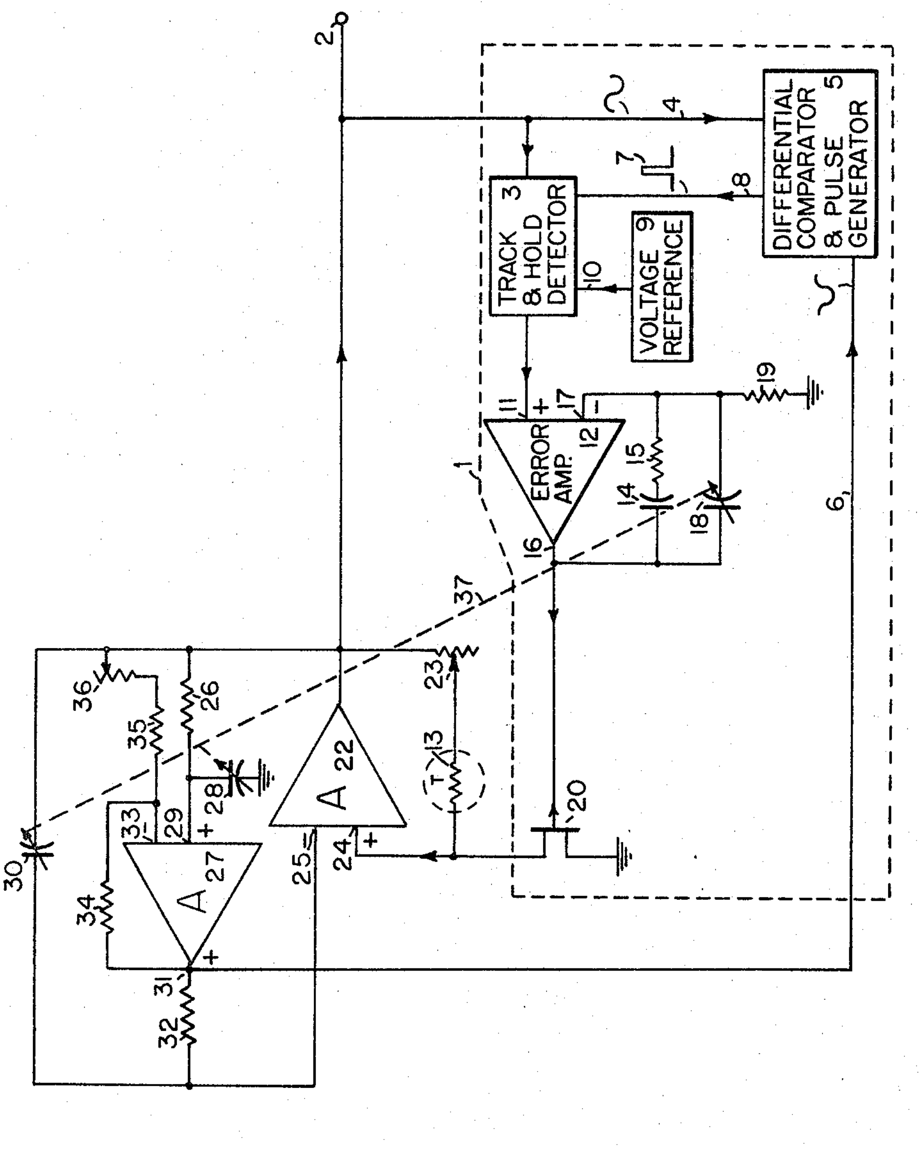
FIG. 1 is a diagram of a complete system, with the track and hold servo control circuit applied to control the amplitude of an oscillator.

In FIG. 1 the doted rectangle 1 encloses the track and hold control circuit itself. The rest of the apparatus in the figure comprises an electrical oscillator, the amplitude of the output of which is controlled as an example of the application of the control circuit.

The signal amplitude to be controlled is present at terminal 2, from whence it is impressed upon track and hold detector 3, and via conductor 4 to differential comparator and pulse generator 5. An equivalent output at quadrature phase with respect to the phase of the signal on conductor 4 is impressed upon comparator 5 via conductor 6, from the circuit of the oscillator, to be later described.

Control pulse 7 is conveyed from the pulse-generating portion of entity 5 by conductor 8. Reference 9 is a battery or equivalent Zener diode which provides a voltage reference, via conductor 10, for the operation of detector 3.

The output from track and hold detector 3 is a voltage of relatively constant amplitude near zero volts. This is impressed upon the non-inverting input 11 of error amplifier 12, which is a differential operation amplifier having a high input impedance, such as a value of $10^{11}$ ohms. This amplifier is provided with a feedback path of long time constant 14 and 15, coactive with resistor 19. Capacitor 14 is connected in series with resistor 15 and these two between output 16 and a second input 17. Amplifier 12 is also provided with a second feedback path of short time constant comprised of capacitor 18, also coactive with resistor 19. Capacitor 18 is shunted across prior elements 14 and 15. One end of resistor 19 is connected to second input 17 and the other end to a signal ground, which may be connection common throughout the apparatus, or that and a conductive connection to an actual ground as well.

The amplitude of the output of the oscillator is controlled by semiconductor active element 20, of which the FET shown is typical. The gate thereof receives the sampling signal from error amplifier 12, the source of the FET is connected to ground and the drain to a feedback path of the oscillator.

The oscillator may be of the bridge type, as shown in FIG. 1, in which instance the quadrature (90°) component of the output signal is easily obtained.

Differential operational amplifier 22 comprises the main oscillator element, in combination with plural feedback paths. Such an amplifier is an article of commerce and is further identified later, being of the same type as used for amplifier 12. Adjustable resistor 23 is in series with temperature-sensitive resistor 13 in a positive feedback loop, from output 2 to positive input 24. Resistor 23 rerves as a servo loop balance adjustment. Resistor 13 has a positive temperature coefficient, the same as that of FET 20 and serves to negate the effect of change of ambient temperature on the apparatus. These resistors comprise the upper leg of a voltage divider, the lower leg of which is FET 20. The latter is connected from positive input 24 to signal ground. The effective resistance of FET 20 is controlled by the D.C. voltage on its gate, and this is supplied as the output from error amplifier 12.

A negative feedback loop for amplifier 22 is formed between output 2 and negative input 25. Therein, resistor 26 is connected to output 2 and to the positive input to a second operational amplifier 27, which is adjusted by plural feedback paths to have a gain of unity. Capacitor 28 is connected from positive input 29 of amplifier 27 to ground. A second capacitor 30 is connected from output 2 of the whole oscillator to output 31 of amplifier 27 through series resistor 32.

When capacitor 30 has four times the capacitance of capacitor 28 and resistor 32 has the same resistance as resistor 26, then the phase shift at terminal 29 is 60° lagging that at terminal 2.

In order to obtain the desired 90° phase shift, advantage is taken on the negative input terminal 33 of amplifier 27. Resistor 34 is connected from there to the output terminal 31 of amplifier 27 and a fixed resistor 35 in series with an adjustable resistor 36 is connected from terminal 33 to terminal 2. The signal flowing in this all-resistive circuit (34, 35, 36) is 180° removed in phase from the signal flowing at output 2 with respect to that at output terminal 31. Upon suitable adjustment of resistor 36 the negative signal amplitude can be adjusted to swing the resultant phase at terminal 31 of 90° lagging, from whence it is conveyed to comparator 5 via conductor 6. Typical values for these circuit components for a signal frequency 1,000 hertz are; for resistors 26 and 32, 31,800 ohms each, for capacitor 28, 0.025 microfarad (mf.), and for capacitor 30, 0.01 mf.

While the track and hold servo control circuit of this invention is substantially aperiodic in its functioning, when the operating range covers many octaves, such as from 10 to 100,000 hertz, it is desirable that capacitors 18, 28 and 30 be ganged and that there be four capacitance values available for each of the three capacitors in substantially a 10 to 1 ratio from capacitance value to capacitance value. This is conveniently arranged by employing a three-gang four-position switch, which is indicated by dotted line 37 in FIG. 1.

Figure 2:
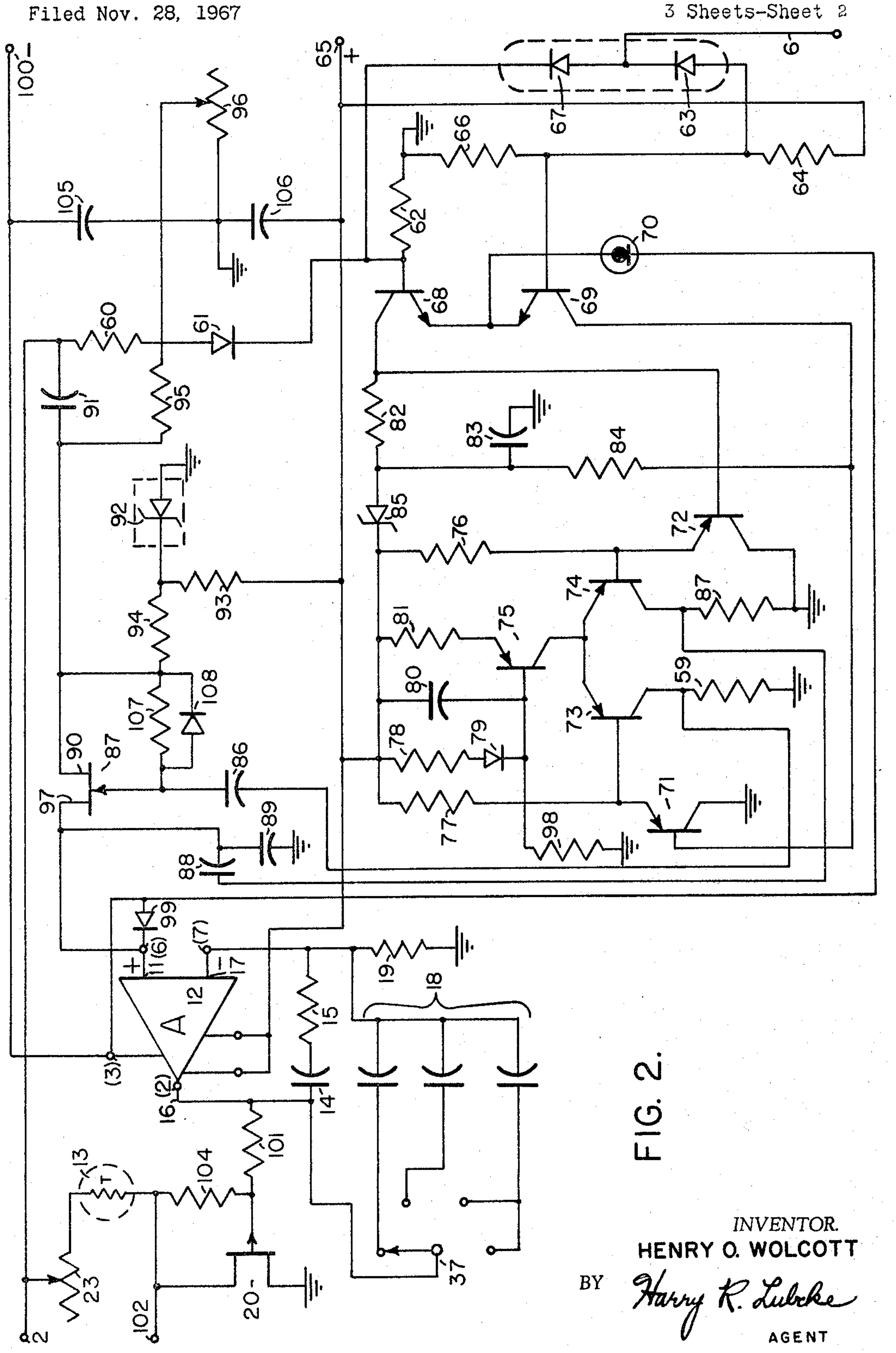
FIG. 2 is a schematic diagram of the track and hold servo circuit itself.

In the detailed schematic diagram of the track and hold servo circuit itself of FIG. 2, the in-phase input to the device enters from terminal 2, this being the output of an oscillator or equivalent, as in FIG. 1. This terminal is directly connected to isolating resistor 60, which may have a resistance of the order of 7,000 ohms, and therethrough to the anode of diode 61. The cathode thereof connects through resistor 62, of 2,000 ohms, to ground.

Figure 3:
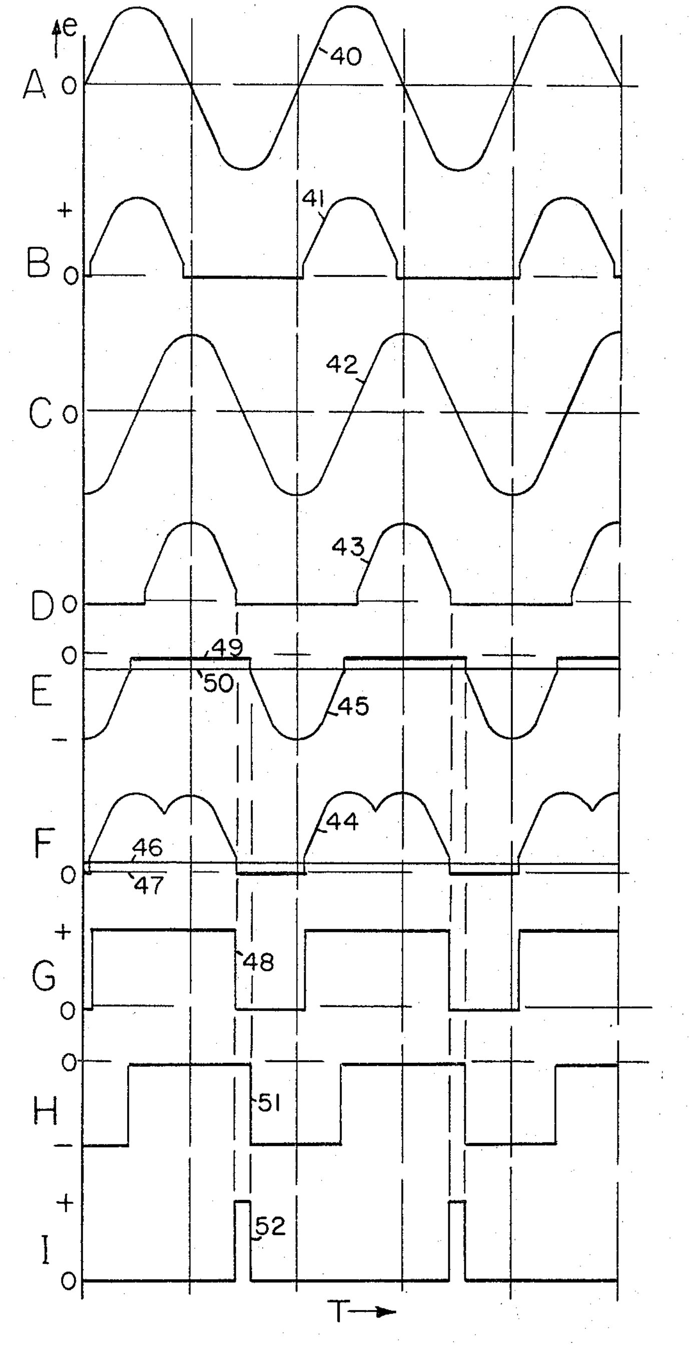
FIG. 3 shows waveforms involved in the operation of the servo circuit.

The result of the operation of this part of the circuit is shown in the waveforms of FIG. 3, A and B. The signal waveform 40 is typically, although not necessarily, a sinusoidal wave. Waveform 41 is the positive half-wave segments of waveform 40, and appears as a voltage across resistor 62 as the result of the functioning of diode 61. In FIG. 3 each of the waveforms has voltage as an ordinate and a common abscissa of time. A typical amplitude for the signal at terminal 2 is 5 volts, RMS, thus a peak-to-peak value of slightly over 14 volts. Resistor 60 reduces this to half, or 2.5 volts RMS, for waveform 40.

In a similar manner, the quadrature input to the track and hold circuit enters via conductor 6, as in FIG. 1. This conductor connects directly to the anode of diode 67, the cathode of which connects to resistor 62, and therethrough to ground.

The quadrature waveform is illustrated at 42 in FIG. 3C, is displaced in time by 90° (electrical degrees) from waveform 40, and may have an amplitude of 2.5 volts RMS. Waveform 43, in FIG. 3D, is composed of the positive half-wave segments of waveform 42. It appears as a voltage across resistor 62 as the result of the functioning of diode 67.

A third diode 63 is connected in this part of the circuit, with the cathode connected to the anode of diode 67 and the anode to resistor 64. The second terminal of this resistor connects to a low voltage power supply, say of 12 volts, which is connected with positive terminal at 65. The resistor 64 is also connected to resistor 66 and therethrough to ground. The positive bias thus placed upon diode 63 gives a desirable duration to gating pulse 52, FIG. 3I, such as 15 microseconds for an operating frequency of 1,000 hertz. Resistor 64 may have a resistance of 300,000 ohms and resistors 62 and 66 a resistance of 2,000 ohms each.

Diode 63 provides negative half-cycles 45 of quadrature waveform 42, as shown in FIG. 3E. Diode 61 may be a fast recovery silicon diode, as the 1N914, while diodes 63 and 67 are preferably of the hot carrier (Schottky barrier) type, such as the HPA 2900. The latter metal oxide diodes provide superior performance by exhibiting faster recovery at high frequencies, such as frequencies of the order of 100,000 hertz.

A pair of transistors 68, 69, which may be of the NPN dual type 2N3423, comprise a differential amplifier, and form an important part of track and hold detector 3 of FIG. 1. The base of transistor 68 is directly connected to the cathode of diode 61 and also to the cathode of diode 67. This results in waveforms 41 and 43 being impressed upon the base, the combination being waveform 44 of FIG. 3F. Waveform 42 lags waveform 40 by 90°, thus waveform lags behind waveform 41 by 90°. The resultant waveform 44 has a double upper peak and a flat dwell at zero amplitude.

In FIG. 3F the limit of amplitude acceptance of differential amplifier 68, 69 is small compared with the amplitude of waveshape 44 impressed upon it. The acceptance amplitude is restricted to that included between horizontal dotted lines 46, 47. The input to the differential amplifier is therefore essentially a rectangular waveshape, being waveshape 48 of FIG. 3G.

Similarly, the base of transistor 69 is directly connected to the anode of diode 63, which results in waveform 45 being impressed thereon. This acceptance amplitude is also restricted, as to between lines 49 and 50. Thus, a relatively rectangular input waveform 51 results, as shown in FIG. 3H. In practice it has been found that the differential amplifier should be overdriven about twenty times, so that a desired degree of rectangularity is obtained.

The differential amplifier provides an output that is the difference between the two effective input waveforms 48 and 51. A short positive-going pulse 52 of FIG. 3I is thus formed only when waveforms 48 and 51 are both at zero level.

Each pulse 52 occurs only when quadrature signal 42 is passing through zero amplitude and when the in-phase signal 40 is at its negative peak. This gives an accurately-timed gating pulse that is used to sample the amplitude of signal 40 at its negative peak. When this signal is at its positive peak a pulse 52 is not obtained because waveform 44 is at saturation instead of zero and transistor 68 is already at saturation. The zero axis voltage of the waveform of FIG. 3I occurs when transistor 68 is saturated; the peak 52 of this waveform occurs when transistor 68 is passing its normal current, which is half of the flow through current regulator 70.

The polarities of the waveforms shown in FIG. 3 provides a pulse 52 suited to turn on a FET 87 of the N channel type. At the present state of the art this type of FET has a superior figure of merit; lower "on" resistance and lower "off" capacitance.

However, a P channel FET may be used as element 87 by reversing the connections of diode 61 and taking an opposite polarity of output pulse; i.e., from transistor 74 instead of transistor 73 in FIG. 2. For this modification control FET 20 must also be of the N channel type.

Pulse 52 is formed at the time when both diodes 63 and 67 are not conducting because of the threshold effect in semiconductor diodes. These two diodes are preferably housed in a small heated enclosure, whereby the threshold effect is maintained constant regardless of usual changes in ambient temperature. While silicon diodes may be used for elements 63 and 67, the metal oxide type previously mentioned provides more accurate performance at and near zero conduction, thereby insuring an essentially rectangular shape for pulse 52.

A typical sampling pulse duration is 4% of the duration of a half-cycle of the signal waveform being controlled. This duration is automatically maintained for apparatus operating over a range of frequencies since the sampling pulse is formed in comparator 5 (diodes 63, 67 and transistors 68, 69) from the signal waveform being controlled.

Element 70 is a semiconductor constant current regulator, such as a 1N5314, which regulates at 4.7 milliamperes. It provides a high A.C. impedance for the dual emitters of transistors 68, 69. This insures equal gain in the transistors before and after the quadrature signal passes through zero amplitude, thus an equal duration of pulse 7 before and after that zero point.

Resistor 82 is the collector resistor for transistor 68 and resistor 84 is the collector resistor for transistor 69. These resistors connect to positive voltage power supply terminal 65 through Zener diode 85, which drops the voltage by 3.3 volts to 8.7 volts in a typical embodiment. Capacitor 83, connected from Zener side of the resistors to ground provides signal frequency bypass. Typically, the resistance of resistor 82 is 750 ohms, while that of resistor 84 is 1,200 ohms. Unequal resistance values are utilized to unbalance subsequent transistor stages, thereby to increase the output voltage swing. This causes these stages to be at maximum output voltage level when the input signal to the input pair of transistors 68 and 69 is instantaneously at zero voltage. When a different signal value is applied soon thereafter to transistors 68 and 69 the output stages swing fully to their opposite states. This gives a full output swing rather than half that amount, should equal resistance values for resistors 82 and 84 be employed.

While one stage of a differential amplifier (transistors 68, 69) will accomplish the function of differential comparator and pulse generator 5 (FIG. 1), it is preferable to follow it with further stages as intimated above to enhance the rectangularity of pulse 52 and to obtain exemplary operation at high frequencies. Accordingly, the collector of transistor 68 is connected to the base of transistor 72 and the collector of transistor 69 to the base of transistor 71. Transistors 71, 72 may be the Motorola type MPS6523. The collector of each is connected to ground, thus providing a relatively high impedence input of the emitter-follower connection and isolation between transistor 68, 69 and those which follow. The emitter-follower output is developed across resistors 76, 77, respectively. The bases of transistors 71, 72 have a positive D.C. bias because of the conductive path therefrom back to positive voltage supply terminal 65. Thus, the collectors of each may be connected to ground. Resistors 76, 77 may have a resistance of 1,000 ohms each, and do connect to positive supply terminal 65.

The emitter of transistor 71 connects directly to the base of second successive differential amplifier stage transistor 73, and the emitter of transistor 72 connects directly to the base of companion transistor 74. Transistors 73, 74 may be the PNP type 2N4313. The emitters thereof are connected together and to the collector of transistor 75. The latter acts as a constant current regulator, as at 10 milliamperes, and may be a PNP type 2N3250. The bases of transistors 73, 74 are held at a positive voltage level by connection to the preceding emitter-follower transistors 71, 72.

Transistor 75 base is biased through a voltage divider from positive terminal 65 to ground, which includes resistor 78, of 1,000 ohms resistance and 98, of 6,000 ohms. Diode 79 is included between the two resistors with its anode directed toward the positive voltage supply so that it will be in the conducting mode. It may be a 1N625. It functions as temperature compensation means for transistor 75 by altering the bias votage on the base thereof such that the current-carrying characteristic of the emitter-base diode of the transistor as a function of temperature is nullified. Transistor 75 is merely a constant current regulator for D.C., thus capacitor 80 shunts the circuit from base to supply terminal 65, employing a capacitance of 0.1 mf. This tends to maintain constant current regulation at high signal frequencies. The emitter of transistor 75 is also connected to positive terminal 65 through resistor 81, which may have a resistance of 100 ohms.

The short-duration properly-rectangular pulse 52 of FIG. 3I is taken from the collector of transistor 73 as a voltage drop over resistor 59, of 500 ohms resistance, the second terminal of which resistor is connected to ground. The pulse is conveyed through capacitor 86, of 0.1 mf. capacitance, to the gate of error-signal-producing first semiconductor active element FET 87. An output of opposite polarity is similarly taken from the collector of transistor 74, over resistor 87, of 500 ohms, and is connected through a small capacitor 88, of 7 picofarads capacitance, to drain 97 of FET 87. This output is the inverse of waveform 52, having short duration negative pulses and is applied to FET 87 to reduce a small variation in amplitude that otherwise occurs in the output of that device.

Capacitor 89, of 0.005 mf. capacitance, connects between drain 97 and ground and is the capacitor that accepts the charge for the sample and hold function.

The error signal is formed at the drain 97 of FET 87. In addition to the connection to the gate previously described, two connections are made to source 90 of this FET.

The first is an A.C. input of the in-phase signal from terminal 2, which is affected through capacitor 91. A capacitance of the order of 40 microfarads is required for this capacitor if the low end of the frequency range to be handled is at 10 hertz. A film dielectric capacitor of 50 volts working voltage is suitable. The relatively low impedance of other elements connected to the source requires the large capacitance.

The second connection to source 90 is a constant voltage reference, or supply, against which the error signal is generated. This may be a battery, having, say, a voltage of 7 volts, with the negative terminal thereof grounded.

In commercial apparatus; however, the voltage reference is provided by Zener diode 92, which may be the 9 volt type 1N939. The anode is connected to ground and the cathode to the positive voltage terminal 65 through resistor 93, of 350 ohms resistance. Approximately 7 volts is required upon the source of FET 87, thus an adjustable voltage divider is provided, which allows amplitude adjustment for the control level of the whole track and hold circuit. The voltage divider is comprised of resistors 94, 95, 96, connected in series from the cathode of Zener diode 92 to ground, with resistor 96 preferably a variable resistor to provide the manual adjustment. The three resistors have resistances of 4,420, 15,000 and 2,500 (max.) ohms, respectively.

When sampling pulse 52 is impressed upon the gate of FET 87 the FET conducts. The combined signal to be controlled (from input terminal 2) and the reference voltage (from diode 92) being constantly impressed upon the source of the FET the resultant produces a signal at drain 97. This signal varies according to the negative peak value of the signal from terminal 2 insofar as this departs from the reference voltage; i.e., it "tracks" the source voltage during the brief duration (as 4%) of pulse 52 with respect to a half-wave of the signal being controlled. At the end of the duration of the pulse the charge upon capacitor maintains the voltage existing at drain 97 until the start of the next pulse 52. FET 87 is non-conducting during the non-pulse interval. Error amplifier 12 is arranged to have its positive input terminal 11 (pin (6) in the established nomenclature of these amplifiers) a high impedance input, thus the charge on capacitor 89 is quite accurately maintained during the interval between gating pulses, as to 0.1% or better.

Error amplifier 12 is a known transistorized differential amplifier with a FET input stage. Such operational amplifiers as the K & M Electronics Corp., model KM41, or the Analog Devices, Inc., Series 147 are suitable. External thereto, diode 99 is connected with the cathode to the "plus" (non-phase-inverting) input terminal 11 (pin 6) of amplifier 12 and the anode to a negative voltage supply terminal 100, which may have a voltage of —12 volts. Pin terminal (3) of the amplifier also connects to terminal 100. The diode may be a 1N456A. It compensates for the gate to drain leakage current of the input FET stage of operational amplifier 12, and is preferred although the current involved is only of the order of 50 picoamperes.

Negative (phase-inverting) input terminal 17 of amplifier 12 connects to two feedback loops, as was discussed in connection with FIG. 1. The long time constant circuit is comprised of capacitor 14, of 0.68 microfarads capacitance, and resistor 15, of 100,000 ohms resistance. These are connected between output terminal 16, pin (2), and input terminal 17, pin (7). The feedback circuit is completed with the inclusion of resistor 19, connected from terminal 17 to ground. The resistance of resistor 19 may be 100,000 ohms.

The short time constant feedback circuit is comprised of one of the three capacitors bracketed as 18, the selection being made according to the ganged switch arrangement 37 of FIG. 1, which label is also given to the single-pole four-throw switch shown in FIG. 2. It is possible to use the same capacitance value, 0.005 mf., for ranges 10,000 to 100,000 hertz and 1,000 to 9,900 hertz. The next lower frequency capacitance is preferably 0.047 mf., for the 100 to 999 hertz band, and the lowest frequency band, from 10 to 99 hertz, employs a capacitance of 0.47 mf. The left-hand terminal of each capacitor returns to output 16, pin (2), of error amplifier 12, through the contacts of one wafer of the range change switch 37, as shown in FIG. 2.

The output 16 of the error amplifier is connected to the gate of P channel FET 20, this being a second semiconductor active element. Resistor 101, of 274,000 ohms resistance, is interposed in this connection. The signal applied is a varying direct current (D.C.), which is altered during each sampling pulse 52 as required to keep the amplitude of the controlled signal 40 of FIG. 3 at a constant value. In practice this is usually a small change occurring over a period of a minute or more, but a transient change in the amplitude of signal 40 alters the input level of error amplifier 12 during the next occurring gating pulse 52. The alteration of level is the difference between the normally equal negative peak value of waveform 40 and the constant value of voltage from voltage reference 92, vs. the new value for waveform 40 and the same constant value for the voltage reference. In the normal situation of equality between the negative peak of waveform 40 and the positive constant voltage reference from Zener diode 92 the resultant voltage at the source of FET 87 is zero. Thus, no current flows and any temperature effects of the FET are of no significance. Even when there is a nominal correction the current flow will be small and so any effect of temperature will also be small.

In practice it is found that a small peak signal from the peak of waveform 40 appears in the drain signal of FET 87 because of the operation of the gate and source with the potentials applied, as has been described. Also, an additional residual pulse signal appears because of the gate to drain capacitance of FET 87. However, the reverse polarity signal from the output of transistor 74, applied through capacitor 88 to drain 97 almost completely cancels out the small variation.

In FIG. 2, as in FIG. 1, the source of FET 20 is connected to ground. The drain is connected to terminal 102, for connection to input 24 of the oscillator or equivalent device 22, as explained in connection with FIG. 1. A further resistor 104, of 275,000 ohms resistance, is connected from gate to drain. A temperature sensitive resistor 13 of 2,700 ohms nominal resistance and with a temperature characteristic of plus 7,000 parts per million per degree centigrade is also connected to the drain. The second terminal of resistor 13 is connected to one terminal of adjustable resistor 23, the adjustable arm of which connects to terminal 2. This circuit arrangement was discussed in connection with FIG. 1, as being part of the oscillator, of which FET 20 is the lower arm of a voltage divider and resistor 13 gives temperature compensation for FET 20.

Capacitor 105, of 0.1 mf. capacitance, is connected from negative voltage supply terminal 100 to ground for accomplishing usual bypass filtering of the power supply employed. Capacitor 106, of equal capacitance, is connected from positive voltage terminal 65 to ground for the same reason.

Resistor 107 connects between source 90 and the gate of the FET 87, with a resistance of the order of 16 megohms. It is shunted by diode 108, with the anode thereof connected to the gate. This diode is preferably of the hot carrier type having a low voltage threshold, as the HPA-2900. Elements 107 and 108 comprise an improved clamp and initially zero bias circuit for FET 87. Diode 108 conducts at a smaller voltage than the inherent diode between the gate and source of the FET.

From the above description it will be apparent that the track and hold servo control circuit of this invention exercises corrective amplitude control on each cycle of the signal controlled. The absence of the usual long time constant filter of the prior art gives very fast correction. Digital voltmeters are frequently tested with apparatus of the type described herein and the rapid response of such voltmeters causes troublesome variations in the readings unless the control on the oscillator is even more rapid. The circuit of this invention is also valuable in automatic testing equipment, since it has fast recovery after a frequency change.

Although this invention has been described in its preferred form with particularity, the disclosure thereof has been made only by way of example. Various changes in circuit component values and circuit details may be made without departing from the spirit and scope of the invention as hereinafter claimed.

I claim:

1. An electrical track and hold servo control circuit comprising:

(a) a first input circuit (62, 67) to rectify at a given phase an alternating electrical signal to be controlled (40), (b) a second input circuit (63, 66) to rectify said electrical signal at quadrature phase (42) with respect to said given phase, (c) an electrical comparator (5) (68, 69) connected to said first and second input circuits and having an output circuit (59), to produce a pulse (7) (52) of short duration with respect to the period of alternation of said electrical signal at the time said signal at quadrature phase passes through zero amplitude, and the signal of given phase also passes through peak amplitude of one polarity, (d) a first semiconductor active element (87) connected to the output circuit of said electrical comparator to gate said first semiconductor active element, and connected to a supply of said signal of given phase and to a supply of constant reference amplitude (92)

to form an error signal according to the relation between the amplitude of said signal of given phase and said constant reference amplitude, (e) a capacitor (89) connected to said first semiconductor active element to hold said error signal amplitude until the next amplitude thereof is formed, (f) an error amplifier (12), having an output circuit (16), having an input circuit (11) connected to said capacitor, having a first feedback circuit (14, 15, 19) of long time constant to provide high gain in said error amplifier, and having a second feedback circuit (18, 19) of short time constant to provide low gain in said error amplifier, and (g) a second semiconductor active element (20) connected to the output circuit (16) of said error amplifier, and to means (13, 23) controlling said alternating electrical signal for controlling said signal according to the output from said error amplifier.

2. The control circuit of claim 1, in which said first and second input circuits include:

(a) a diode (63 or 67) having a voltage threshold below which voltage it will not conduct, thereby introducing a dwell at zero amplitude value at the beginning and the end of each rectified half waveshape.

3. The control circuit of claim 1, in which said comparator comprises:

(a) a differential amplifier (68, 69) having a small acceptance range of signal input with respect to the outputs of said first and said second input circuits to which it is connected, whereby said differential amplifier is saturated and thus provides no output, save during the interval when said signal at quadrature phase (42) passes through zero amplitude and the signal of given phase( 40) also has a peak value of one polarity.

4. The control circuit of claim 1, in which said first feedback circuit is comprised of:

(a) a capacitor (14) and a resistor (15) in series connected between said output circuit (16) and a negative feedback input (17) of said error amplifier (12), and (b) a resistor (19) connected between said negative feedback input and signal ground.

5. The control circuit of claim 1, in which said second feedback circuit is comprised of:

(a) a capacitor (18) connected between said output circuit (16) and a negative feedback input (17) of said error amplifier (12), and (b) a resistor (19) connected between said negative feedback input and signal ground.

6. The control circuit of claim 1, in which:

(a) said first semiconductor element (87) is a field effect transistor having a source, a gate and a drain, (b) a supply (92) of constant reference voltage amplitude connected to said source, (c) means (91) also connected to said source to convey said signal of given phase to said source, (d) a connection from the output (59) of said comparator to said gate, (e) said capacitor (89) connected to said drain to perform said hold function, and (f) a connection from said drain to said input circuit (11) of said error amplifier (12).

7. The control circuit of claim 1, in which:

(a) said second semiconductor active element (20) is a field effect transistor having a source, a gate and a drain, (b) a connection from the output circuit (16) of said error amplifier (12) to said gate, (c) a connection from said source to signal ground, (d) means to produce (22) said alternating electrical signal having an amplitude control circuit (24, 13, 23, 2), and (e) a connection from said drain to said amplitude control circuit.

8. The control circuit of claim 1, in which:

(a) a supply (92) of constant reference voltage amplitude having a particular voltage amplitude of one polarity, and (b) means to connect said supply to said first semiconductor active element to provide an equal but opposite voltage thereat with respect to the peak voltage value of said electrical signal (40) of given phase applied through said same means to connect to said first semiconductor active element, whereby the net voltage impressed upon said first semiconductor active element is typically zero, and variation of the electrical characteristic of said first semiconductor active element with temperature is relatively impotent to affect the electrical performance thereof in said control circuit.

9. The control circuit of claim 1, in which said comparator comprises:

(a) a first pair of transistors (68, 69) connected to form a saturable differential amplifier and connected to said first and second input circuits, (b) a second pair of transistors (72, 71) direct-connected to said first pair of transistors, and (c) a third pair of transistors (73, 74) direct-connected to said second pair of transistors, whereby a rectangular pulse is formed from the electrical output of said first and second input circuits during the time said differential amplifier is not saturated.

10. The control circuit of claim 9, which further includes:

(a) a constant current regulator (70) connected to said first pair of transistors to maintain the current flowing through said pair at a constant value, whereby said pulse of short duration (52) is formed with equal duration before and after said signal at quadrature phase passes through zero amplitude.

No references cited.

JOHN KOMINSKI, *Primary Examiner.*